(12) United States Patent
Wedi et al.

(10) Patent No.: US 11,652,028 B2
(45) Date of Patent: May 16, 2023

(54) POWER SEMICONDUCTOR DEVICE AND METHOD FOR FABRICATING A POWER SEMICONDUCTOR DEVICE

(71) Applicant: Infineon Technologies AG, Neubiberg (DE)

(72) Inventors: Andre Wedi, Soest (DE); Carsten Ehlers, Mönchengladbach (DE); Arthur Unrau, Geseke (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/160,612

(22) Filed: Jan. 28, 2021

(65) Prior Publication Data

US 2021/0242111 A1 Aug. 5, 2021

(30) Foreign Application Priority Data

Jan. 31, 2020 (EP) .................... 20154837

(51) Int. Cl.
| | |
|---|---|
| *H01L 23/49* | (2006.01) |
| *H01L 21/48* | (2006.01) |
| *H01L 23/08* | (2006.01) |
| *H01L 23/14* | (2006.01) |
| *H01L 23/31* | (2006.01) |
| *H01L 23/492* | (2006.01) |
| *H01L 23/00* | (2006.01) |

(52) U.S. Cl.
CPC .......... *H01L 23/49* (2013.01); *H01L 21/4825* (2013.01); *H01L 21/4875* (2013.01); *H01L 23/08* (2013.01); *H01L 23/14* (2013.01); *H01L 23/3121* (2013.01); *H01L 23/492* (2013.01); *H01L 24/32* (2013.01); *H01L 24/83* (2013.01); *H01L 2224/32245* (2013.01); *H01L 2224/83801* (2013.01)

(58) Field of Classification Search
USPC ......................................................... 257/668
See application file for complete search history.

(56) References Cited

U.S. PATENT DOCUMENTS

| | | | |
|---|---|---|---|
| 2003/0057572 A1* | 3/2003 | Berry ................... | H05K 3/3421 257/E23.068 |
| 2009/0085189 A1* | 4/2009 | Thoben ................ | H01L 25/072 438/106 |
| 2009/0146272 A1 | 6/2009 | Wieneke et al. | |
| 2010/0052153 A1 | 3/2010 | Koizumi et al. | |
| 2015/0340333 A1 | 11/2015 | Isozaki | |
| 2016/0035658 A1 | 2/2016 | Kessler et al. | |
| 2016/0240451 A1 | 8/2016 | Hwang et al. | |
| 2018/0033711 A1* | 2/2018 | Hartung .............. | H01L 23/3735 |

* cited by examiner

*Primary Examiner* — Ajay Arora
(74) *Attorney, Agent, or Firm* — Murphy, Bilak & Homiller, PLLC

(57) ABSTRACT

A power semiconductor device includes a die carrier, a power semiconductor chip coupled to the die carrier by a first solder joint, a sleeve for a pin, the sleeve being coupled to the die carrier by a second solder joint, and a sealing mechanically attaching the sleeve to the die carrier, the sealing being arranged at a lower end of the sleeve, wherein the lower end faces the die carrier, and wherein the sealing does not cover the power semiconductor chip.

16 Claims, 3 Drawing Sheets

POWER SEMICONDUCTOR DEVICE AND METHOD FOR FABRICATING A POWER SEMICONDUCTOR DEVICE

TECHNICAL FIELD

This disclosure relates in general to a power semiconductor device and to a method for fabricating a power semiconductor device.

BACKGROUND

Power semiconductor devices may comprise contact pins that are configured to electrically couple different components within the power semiconductor device to one another, or to provide a contact to the outside of the power semiconductor device, e.g. to a circuit board. Such pins may be inserted into sleeves that are electrically coupled and mechanically fixed to a substrate of the power semiconductor device, for example by a solder joint. Mechanical stress exerted onto these solder joints, e.g. during fabrication of the power semiconductor device, may cause electrical and/or mechanical failure of the solder joint. It may therefore be desirable to eliminate or at least reduce the mechanical stress that these solder joints are subjected to. Improved power semiconductor devices and improved methods for fabricating power semiconductor devices may help with solving these and other problems.

The problem on which the invention is based is solved by the features of the independent claims. Further advantageous examples are described in the dependent claims.

SUMMARY

Various aspects pertain to a power semiconductor device, comprising: a die carrier, a power semiconductor chip coupled to the die carrier by a first solder joint, a sleeve for a pin, the sleeve being coupled to the die carrier by a second solder joint, and a sealing mechanically attaching the sleeve to the die carrier, the sealing being arranged at a lower end of the sleeve, wherein the lower end faces the die carrier, and wherein the sealing does not cover the power semiconductor chip.

Various aspects pertain to a method for fabricating a power semiconductor device, the method comprising: providing a die carrier, soldering a power semiconductor chip onto the die carrier, thereby forming a first solder joint, soldering a sleeve for a pin onto the die carrier, thereby forming a second solder joint, and mechanically attaching the sleeve to the die carrier with a sealing, the sealing being arranged at a lower end of the sleeve, wherein the lower end faces the die carrier, wherein the sealing does not cover the power semiconductor chip.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless of whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other.

The examples of a power semiconductor device described below may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, power integrated circuits, etc. The examples may also use semiconductor chips comprising vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

The power semiconductor devices described below may include one or more semiconductor chips. By way of example, one or more power semiconductor chips may be included. Furthermore, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

A "sealing" as understood in this disclosure may be a deposited plug, e.g. a polymer, which mechanically fastens a sleeve to a die carrier.

Figure 1A:
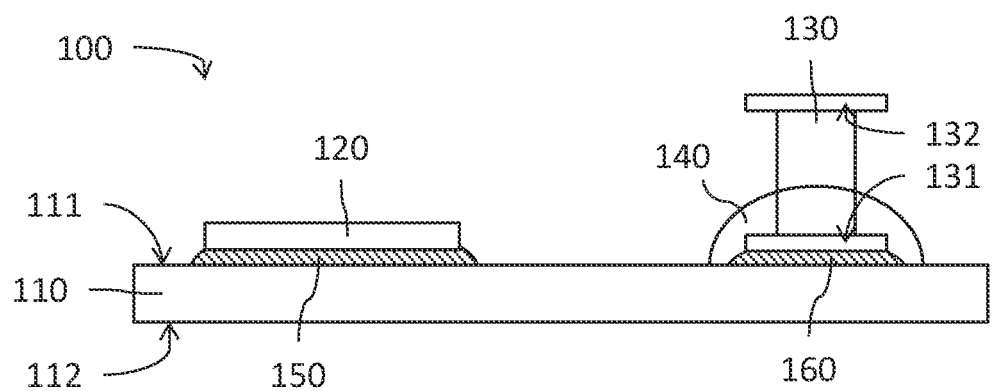
FIGS. 1A and 1B show a sectional view of a power semiconductor device, wherein a sealing is arranged around a sleeve for a pin.
Figure 1B:
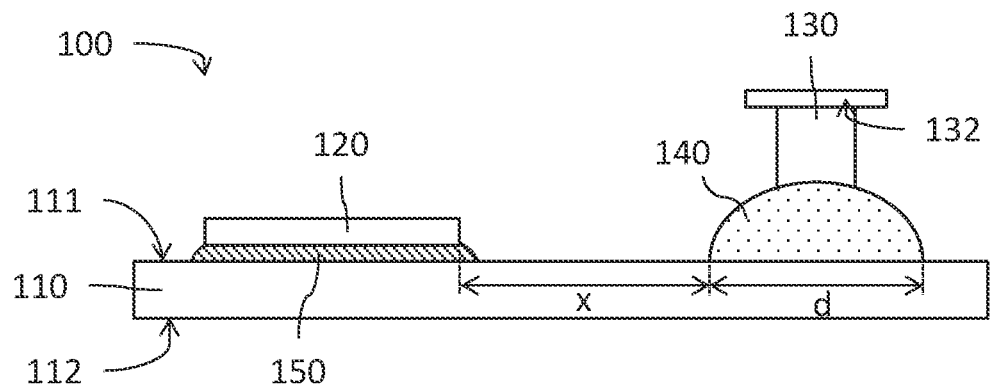

FIGS. 1A and 1B show a power semiconductor device 100 comprising a die carrier 110, a power semiconductor chip 120 and a sleeve 130. Additionally, the power semiconductor device 100 comprises a sealing 140, wherein the sealing 140 mechanically attaches the sleeve 130 to the die carrier 110.

In FIG. 1A, the sealing 140 is shown in a transparent representation such that the sleeve 130 can be seen in its entirety. In FIG. 1B, the sealing 140 is shown in an opaque representation.

The power semiconductor chip 120 is coupled to the die carrier 110 by a first solder joint 150 and the sleeve 130 is coupled to the die carrier 110 by a second solder joint 160. The sealing 140 is arranged at a lower end 131 of the sleeve 130, wherein the lower end 131 faces the die carrier 110. Furthermore, the sealing 140 is arranged in the power semiconductor device 100 such that it does not cover the power semiconductor chip 120.

The power semiconductor device 100 may for example be a power semiconductor package and it may comprise an encapsulation encapsulating the power semiconductor chip 120. The power semiconductor device 100 may comprise external contacts configured to connect the power semiconductor chip 120 to the outside of the encapsulation.

The die carrier 110 may e.g. comprise or consist of Al, Cu or Fe. The die carrier 110 may e.g. be a direct copper bond (DCB), direct aluminum bond (DAB), active metal brazing (AMB) or a similar type of substrate. The die carrier 110 may in particular comprise an upper side 111 and an opposing lower side 112. The upper side 111 may comprise conductive traces which may e.g. be configured to electrically couple the power semiconductor chip 120 to a pin inserted into the sleeve 130.

The lower side 112 of the die carrier 110 may also be electrically conductive. The lower side 112 may be an outer surface of the power semiconductor device 100. According to an example, the die carrier 110 may be arranged on a baseplate such that the lower side 112 faces the baseplate.

The power semiconductor chip 120 may be configured to operate with a high electrical voltage and/or a high electrical current. The power semiconductor chip 120 may comprise a power electrode or a control electrode that is electrically coupled to a pin inserted into the sleeve 130. The power semiconductor device 100 may comprise several sleeves 130, wherein different electrodes of the power semiconductor chip 120 are coupled to pins inserted into the different sleeves 130.

According to an example, the power semiconductor device 100 comprises several power semiconductor chips 120. These power semiconductor chips 120 may be coupled to one another, forming an electrical circuit, for example a half-bridge circuit or an inverter circuit or a converter circuit. Furthermore, different power semiconductor chips 120 may be coupled to different pins.

The sleeve 130 may be configured to have a pin, e.g. a connector pin, inserted into it. The sleeve 130 may comprise or consist of any material that can be soldered onto the die carrier 110. For example, the sleeve 130 may comprise or consist of a metal like Al, Cu or Fe.

The sleeve 130 may comprise the lower end 131 and it may comprise an upper end 132 opposite the lower end 131. The upper end 132, or an upper quarter of the sleeve 130, or an upper third of the sleeve 130, or an upper half of the sleeve 130 may stick out of the sealing 140. However it is also possible that the sealing 140 covers the entire length or almost the entire length of the sleeve 130.

The sleeve 130 may be arranged on the upper side 111 of the die carrier 110. The sleeve 130 may be spaced apart from the power semiconductor chip 120. For example, the sleeve 130 may be spaced apart from the power semiconductor chip 120 by more than 1 mm, more than 5 mm, more than 10 mm, or more than 15 mm. The sleeve 130 may be arranged essentially perpendicular with respect to the upper side 111 of the die carrier 110.

The sealing 140 may for example comprise or consist of a polymer. For example, the sealing 140 may comprise or consist of a polyimide. According to another example, the sealing 140 comprises or consists of a non-polymerized material. The sealing 140 may comprise or consist of an electrically insulating material. The sealing 140 may comprise a single material or it may comprise a material composition. The sealing 140 may be configured to provide a rigid mechanical support and strong fastening of the sleeve 130 on the die carrier 110. The sealing 140 may in particular be configured to couple the sleeve 130 to the die carrier 110 with greater mechanical strength than the second solder joint 160, for example with twice the strength or three times the strength.

Applying the sealing 140 onto the sleeve 130 may comprise depositing the sealing 140 in liquid form (for example, a polymer dissolved in a solvent), e.g. by using a dispensing process, an inkjet process or a spraying process. Applying the sealing 140 may also comprise curing the sealing 140, e.g. by applying heat or radiation like UV light.

The sealing 140 may in particular be configured to mechanically couple the sleeve 130 to the die carrier 110 with sufficient stability. Due to the presence of the sealing 140, the sleeve 130 may be coupled to the die carrier 110 with greater mechanical strength than in the case that no sealing 140 was used and the sleeve 130 was solely mechanically coupled to the die carrier 110 via the second solder joint 160.

As shown in FIG. 1A, the sleeve 130 may comprise a widened brim at its lower end 131, which may be completely covered by the sealing 140. This may increase the strength of the bond between the sleeve 130 and the sealing 140 (and therefore also the strength of the bond between the sleeve 130 and the die carrier 110).

The sealing 140 may completely surround and cover the lower end 131 of the sleeve 130. The sealing 140 may completely surround and cover the second solder joint 160. The sealing 140 may e.g. have the form of a bead. The sealing 140 may be centered on the sleeve 130. The sealing 140 may be in direct contact with the sleeve 130 and with the upper side 111 of the die carrier 110. The sealing 140 may e.g. have a diameter d of 1.5 mm or more, or 2 mm or more, or 2.5 mm or more, or 3 mm or more, or 4 mm or more.

The sealing 140 may essentially have a semi-spherical shape, wherein the sleeve 130 extends out of the top of the semi-sphere (cf. FIGS. 1A and 1B). However, it is also possible that the sealing 140 takes the form of a meniscus surrounding the sleeve 130.

The power semiconductor chip 120, the sleeve 130 and the sealing 140 may be arranged on the die carrier 110 in such a way that the sealing 140 does not touch the power semiconductor chip 120. Between the sealing 140 and the power semiconductor chip 120 there may be a gap x, which may e.g. be more than 1 mm, or more than 1.5 mm, or more than 2 mm, or more than 3 mm.

According to an example, the power semiconductor device 100 may comprise several sleeves 130 and corresponding sealings 140. The sleeves 130 and corresponding sealings 140 may for example be arranged along one or more edges of the die carrier. Furthermore, the power semiconductor device 100 may comprise several power semiconductor chips 120, which may for example be arranged essentially in the center of the die carrier 110.

Figure 2:
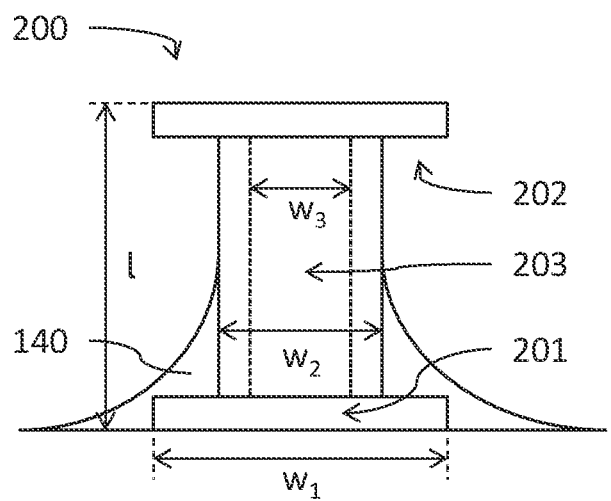
FIG. 2 shows a detail view of a pin and a sealing arranged around the pin.

FIG. 2 shows an example of a sleeve 200 in greater detail. The sleeve 200 may be similar or identical to the sleeve 130. The sleeve 200 comprises a lower end 201 and an opposing upper end 202. The sleeve 200 further comprises a hollow core 203 configured to accept a pin (i.e. a contact pin) of a semiconductor device like the power semiconductor device 100. The sleeve 200 may comprise a widened brim at the lower end 201 and a further widened brim at the upper end 202.

The sleeve 200 may be symmetrical as seen from above the upper end 202 and from below the lower end 201. In particular, both ends 201, 202 may be open such that a pin may be inserted from any of the two ends. This also means that solder material may creep into the hollow core 203 when the second solder joint 160 is formed. This may e.g. be problematic if too much solder material is used for the creation of the first solder joint 160 and the solder material therefore fills up the hollow core 203. This may prevent a pin from being fully inserted into the sleeve 200. For example for this reason it may be beneficial to use the sealing 140 for mechanically binding the sleeve 200 (or the sleeve 130) to the die carrier 110 instead of increasing the amount of solder material to form a larger and stronger solder joint 160.

The widened brim at the lower and upper ends 201, 202 of the sleeve 200 may e.g. have a diameter $w_1$ of 1.5 mm or more, or 1.8 mm or more, or 2 mm or more. The diameter $w_1$ of the widened brim may be smaller than the diameter d of the sealing 140 (compare FIG. 1B), for example smaller by 1 mm or more, 2 mm or more, or 3 mm or more. A diameter $w_2$ of a central part of the sleeve 200 may for example be in the range of about 0.9 mm to about 1.5 mm. A diameter $w_3$ of the hollow core 203 may for example be in the range of about 0.7 mm to about 1.2 mm. The sleeve 200 may have any suitable length l, for example 5 mm or more, or 1 cm or more, or 1.5 cm or more.

The sealing 140 may be arranged around the sleeve 200 such that it completely covers the widened brim at the lower end 201. At least the upper half of the sleeve 130 may stick out of the sealing 140. However, according to an example it is also possible that more than the lower half of the sleeve 200 is covered by the sealing 140. For example, the sealing 140 may cover the sleeve 200 (almost) up to the widened brim on the upper end 202. In the example shown in FIG. 2 the sealing has the form of a meniscus surrounding the sleeve 200.

Figure 3:
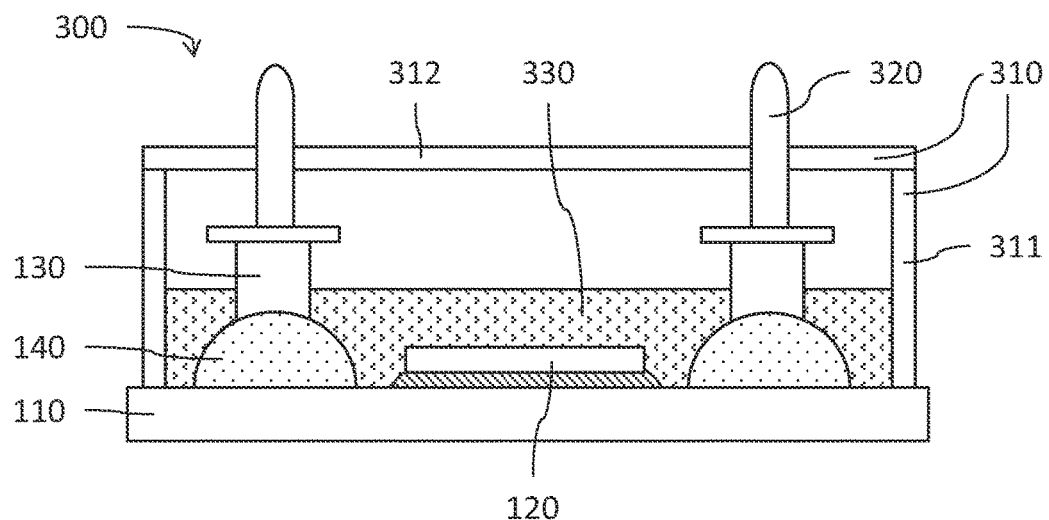
FIG. 3 shows a sectional view of a further power semiconductor device comprising the pin and the sealing and also comprising a frame.

FIG. 3 shows an example of a further power semiconductor device 300, which may be similar or identical to the power semiconductor device 100, except for the differences described in the following.

The power semiconductor device 300 comprises the die carrier 110, at least one power semiconductor chip 120 and at least one sleeve 130 and corresponding sealing 140 as described with reference to the power semiconductor device 100.

The power semiconductor device 300 may furthermore comprise a frame 310, which may e.g. be a plastic frame. The frame 310 may for example comprise sidewalls 311 and a lid 312. The power semiconductor device 300 may also comprise one or more pins 320 inserted into the sleeve(s) 130 and/or an encapsulant 330 encapsulating the power semiconductor chip(s) 120.

The frame 310 may be configured to provide a cavity, wherein the power semiconductor chips 120, sleeves 130, sealings 140 and encapsulant 330 are arranged within the cavity. In the example shown in FIG. 3 the frame 310 is arranged on the upper side of the die carrier 110. However, it is also possible that the power semiconductor device 300 comprises a baseplate, wherein the frame 310 is arranged on the baseplate and the die carrier 110 is completely arranged within the cavity (compare e.g. the power semiconductor device 300' in FIG. 4F).

The pins 320 may be configured to extend out of the frame 310, for example out of the lid 312. The pins 320 may be configured to electrically couple the power semiconductor chips 120 to the outside of the power semiconductor device 300. According to an example, the power semiconductor device 300 may be configured to have a circuit board, e.g. a PCB, arranged on the lid 312, wherein the pins 320 are configured to couple the power semiconductor chips 120 to the circuit board.

Closing the lid 312 may comprise inserting the pins 320 into holes in the lid 312 and coupling the power semiconductor chips 120 to the circuit board may comprise inserting the pins into through-hole connectors of the circuit board. For example due to manufacturing tolerances, which may cause the pins 320 to be arranged on the die carrier 110 in a tilted orientation, these acts may exert a lateral force (a force along the plane of the die carrier 110) onto the second solder joints 160 coupling the sleeves 130 to the die carrier 110. A strong lateral force may cause a crack in a second solder joint 160 and consequently cause an electrical and/or mechanical failure of the semiconductor device.

By using the sealing 140 however, such strong lateral forces may be averted as explained in greater detail further below. The sealing 140 may essentially provide the mechanical bond between the sleeve 130 and the die carrier 110, whereas the second solder joint 160 may only be necessary for providing an electrical connection between the sleeve 130 (i.e. the pin 320) and the die carrier 110.

The encapsulant 330 may be configured to protect the power semiconductor chips 120 from the outside. The encapsulant 330 may for example be a gel. The encapsulant 330 is different from the sealings 140 and it may in particular consist of a different material or material composition than the sealings 140. For example, the sealings 140 may consist of a material or material composition that is not or almost not ductile, whereas the encapsulant 330 may be readily ductile. Furthermore, the sealings 140 may bond comparatively strongly to the die carrier 110 and the encapsulant 330 may bond to the die carrier 110 comparatively weakly. The sealing 140 may have a higher tensile strength than the encapsulant 330, for example twice the tensile strength or three times the tensile strength.

FIGS. 4A to 4F show power semiconductor devices 300 and 300' in various stages of fabrication according to an example of a method for fabricating a power semiconductor device. It should be noted that a power semiconductor device need not necessarily be fabricated in the order of fabrication stages shown in FIGS. 4A to 4F.

Figure 4A:
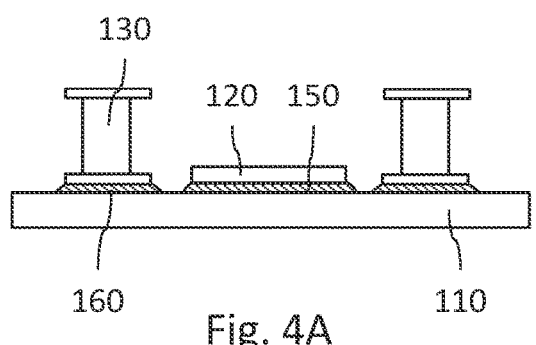
FIGS. 4A to 4F show a sectional view of a power semiconductor device in various stages of fabrication according to an example of a method for fabricating a power semiconductor device.

As shown in FIG. 4A, the die carrier 110 is provided. The power semiconductor die 120 and the sleeves 130 are arranged on the upper side 111 of the die carrier 110 and soldered to the die carrier 110, thereby forming the first and second solder joints 150, 160. The sleeves 130 may be soldered to the die carrier 110 simultaneously with the power semiconductor die 120 or they may be soldered to the die carrier 110 before or after the power semiconductor die 120.

Figure 4B:
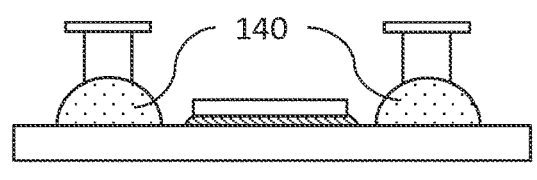

As shown in FIG. 4B, the sealings 140 are arranged on the die carrier 110 around the sleeves 130. Arranging the sealings 140 on the die carrier 110 may comprise depositing sealing material in liquid form, e.g. by dispensing, by using an inkjet or by spraying. The depositing may comprise depositing one or more droplets of the liquid sealing material at or around the sleeves 130 or it may comprise depositing a contiguous film of the liquid sealing material around the sleeves 130.

After the liquid sealing material has been deposited it may be cured in order to fabricate the sealings 140. Curing the liquid sealing material may comprise the application of heat, e.g. a temperature of up to 200° C. and/or the application of radiation, e.g. UV light. According to an example, the curing process may take up to about 10 min, up to about 30 min, or up to about 1 h.

After the curing process the sealings 140 are mechanically robust and they may significantly reduce or even eliminate any mechanical stress that may be exerted onto the second solder joints 160. This may prevent electrical and/or mechanical failures of the second solder joints 160.

Figure 4C:
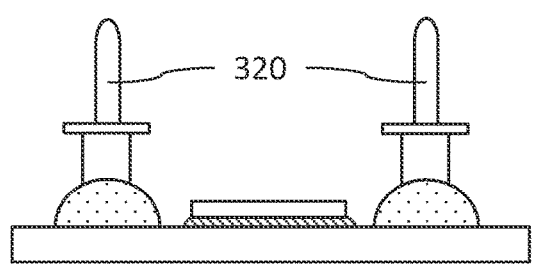

As shown in FIG. 4C, the pins 320 may be inserted into the sleeves 130. The pins 320 and sleeves 130 may for example be configured to form a press-fit connection. According to an example, the pins 320 are inserted into the sleeves 130 after the sealings 140 have been formed.

Figure 4D:
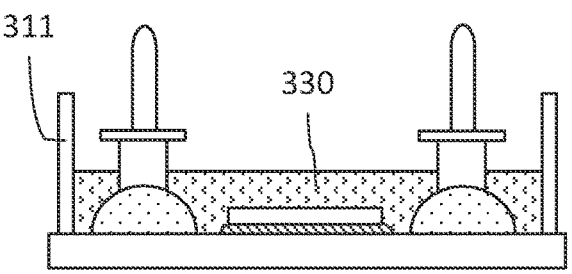

As shown in FIG. 4D, the frame 310 may be arranged over the die carrier 110. According to an example, only the sidewalls 311 of the frame 310 are arranged over the die carrier 110 at this point, such that the encapsulant 330 can be filled into the cavity formed by the frame 310. As mentioned further above, it is also possible that the frame 310 is not arranged over the upper side 111 of the die carrier 110 but instead over a baseplate, wherein the die carrier 110 is attached to the base plate and wherein the die carrier 110 is arranged completely within the cavity formed by the frame 310.

According to the example shown in FIG. 4D, the encapsulant 330 may encapsulate the sealings 140. However, this need not necessarily be the case. According to another example, the encapsulant 330 solely encapsulates the power semiconductor chip 120 but it does not touch the sealings 140. According to another example, the encapsulant 330 encapsulates the sealings 140 only partially. According to yet another example, the power semiconductor device 300 does not comprise the encapsulant 330.

Figure 4E:
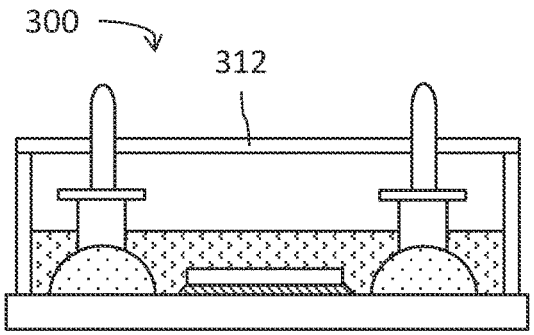

As shown in FIG. 4E, the lid 312 may be arranged over the sidewalls 311, thereby closing the cavity formed by the frame 310. Arranging the lid 312 over the sidewalls 311 may comprise inserting the pins 320 into holes in the lid 312. However, it is also possible that the pins 320 are inserted into the sleeves 130 after the lid 312 has already been put in place. According to an example, the power semiconductor device 300 may further comprise a circuit board arranged over the lid 312. The sealings 140 may help with preventing the formation of cracks in the second solder joints 160 when the lid 312 and/or the circuit board are pinned to the pins 320.

Figure 4F:
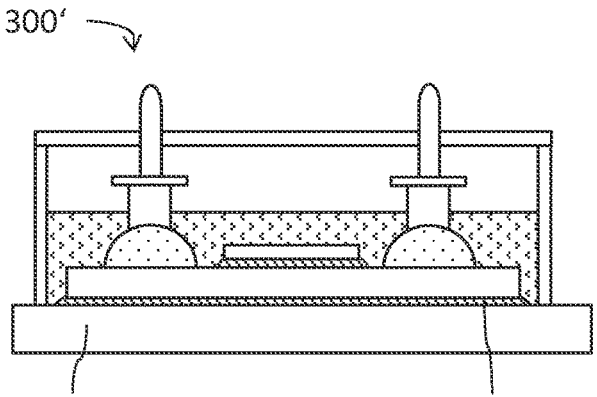

FIG. 4F shows an example of a power semiconductor device 300', which may be identical to the power semiconductor device 300 except that the power semiconductor device 300' also comprises a baseplate 340, wherein the die carrier 110 is attached to the baseplate 340 by a third solder joint 350. Furthermore, the frame 310 is arranged over the baseplate 340 such that the die carrier 110 is arranged completely within the cavity formed by the frame 310.

The third solder joint 350 may e.g. be formed after the first and second solder joints 150, 160 have already been formed. The solder material forming the first and second solder joints 150, 160 may however liquefy again when the third solder joint 350 is formed. In this case, the sealings 140 may help with keeping the sleeves 130 and consequently the pins 320 in the correct position and orientation. In order to do so, the material of the sealings 140 may have a temperature stability that is higher than the soldering temperature of the third solder joint 350. For example, the sealings 140 may be stable at temperatures of about 300° C. or more.

Figure 5:
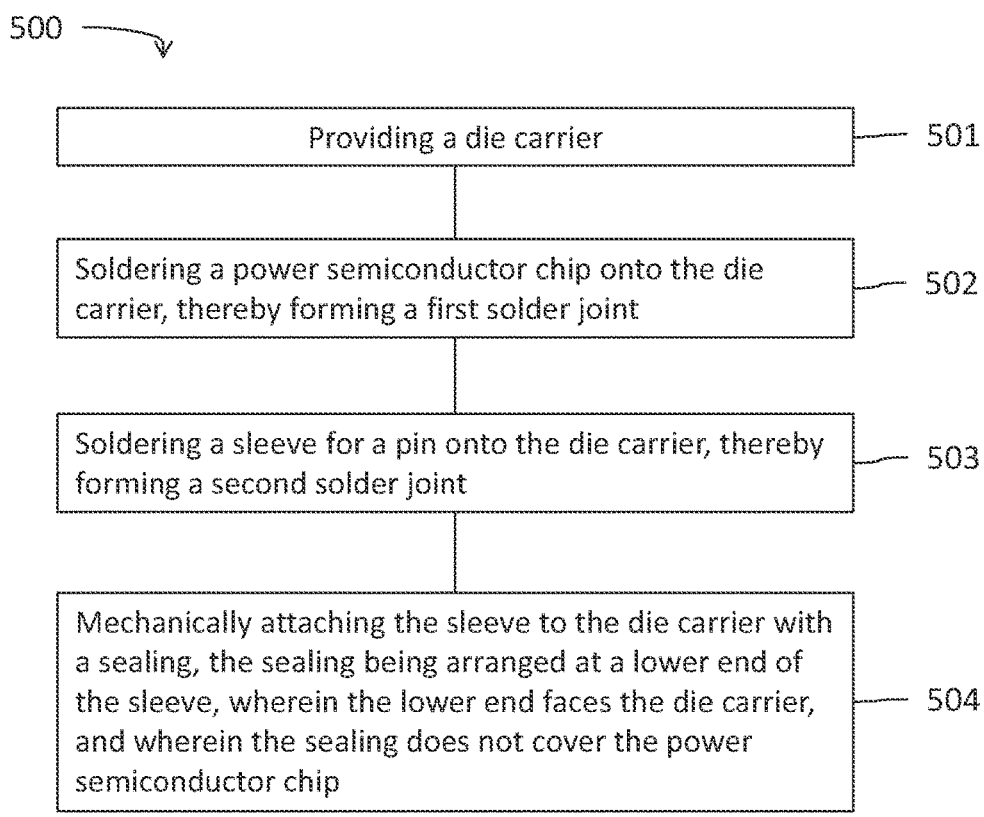
FIG. 5 is a flow chart of a method for fabricating a power semiconductor device.

FIG. 5 is a flow chart of a method 500 for fabricating a power semiconductor device. The method 500 may for example be used to fabricate the power semiconductor devices 100, 300 and 300'.

The method 500 comprises at 501 an act of providing a die carrier, at 502 an act of soldering a power semiconductor chip onto the die carrier, thereby forming a first solder joint, at 503 an act of soldering a sleeve for a pin onto the die carrier, thereby forming a second solder joint, and at 504 an act of mechanically attaching the sleeve to the die carrier with a sealing, the sealing being arranged at a lower end of the sleeve, wherein the lower end faces the die carrier, and wherein the sealing does not cover the power semiconductor chip.

According to an example of the method 500, the sealing may be provided after the first and second solder joints have been formed. Furthermore, the act of mechanically attaching the sleeve may further comprise dispensing the sealing around the lower end of the sleeve, followed by curing the sealing, e.g. by heating the sealing to a temperature of 200° C. or less or by applying UV light. The method 500 may further comprise an act of soldering the die carrier to a baseplate, thereby forming a third solder joint.

In the following, the power semiconductor device and the method for fabricating a power semiconductor device are further described using specific examples.

Example 1 is a power semiconductor device, comprising: a die carrier, a power semiconductor chip coupled to the die carrier by a first solder joint, a sleeve for a pin, the sleeve being coupled to the die carrier by a second solder joint, and a sealing mechanically attaching the sleeve to the die carrier, the sealing being arranged at a lower end of the sleeve, wherein the lower end faces the die carrier, and wherein the sealing does not cover the power semiconductor chip.

Example 2 is the power semiconductor device of example 1, wherein the sealing covers the second solder joint.

Example 3 is the power semiconductor device of example 1 or example 2, wherein the sealing comprises a polymer.

Example 4 is the power semiconductor device of one of the preceding examples, wherein the sealing does not touch the power semiconductor chip.

Example 5 is the power semiconductor device of one of the preceding examples, further comprising: an encapsulant encapsulating the power semiconductor chip, wherein the encapsulant has a different material composition than the sealing.

Example 6 is the power semiconductor device of example 5, wherein the sealing has a higher tensile strength than the encapsulant.

Example 7 is the power semiconductor device of one of the preceding examples, wherein the die carrier is a DAB, a DCB, or an AMB.

Example 8 is the power semiconductor device of example 7, wherein the sleeve is arranged on an upper conductive layer of the die carrier and wherein the sealing is at least partially arranged on the upper conductive layer.

Example 9 is the power semiconductor device of one of the preceding examples, further comprising: a baseplate, wherein the die carrier is attached to the base plate by a third solder joint.

Example 10 is the power semiconductor device of one of the preceding examples, further comprising: a plastic frame, wherein the power semiconductor chip is arranged within a cavity formed by the plastic frame and wherein the pin is configured to extend out of the plastic frame.

Example 11 is a method for fabricating a power semiconductor device, the method comprising: providing a die carrier, soldering a power semiconductor chip onto the die carrier, thereby forming a first solder joint, soldering a sleeve for a pin onto the die carrier, thereby forming a second solder joint, and mechanically attaching the sleeve to the die carrier with a sealing, the sealing being arranged at a lower end of the sleeve, wherein the lower end faces the die carrier, wherein the sealing does not cover the power semiconductor chip.

Example 12 is the method of example 11, wherein the sealing is provided after the first and second solder joints have been formed.

Example 13 is the method of example 11 or example 12, wherein mechanically attaching the sleeve comprises: dispensing the sealing around the lower end of the sleeve, and curing the sealing.

Example 14 is the method of example 13, wherein the curing comprises heating the sealing to a temperature of 200° C. or less or wherein the curing comprises applying UV light.

Example 15 is the method of one of examples 11 to 14, further comprising: soldering the die carrier to a baseplate, thereby forming a third solder joint.

Example 16 is an apparatus comprising means for performing the method according to one of examples 11 to 15.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power semiconductor device, comprising:
   a die carrier;
   a power semiconductor chip coupled to the die carrier by a first solder joint;
   a sleeve for a pin, the sleeve being coupled to the die carrier by a second solder joint; and
   a sealing mechanically attaching the sleeve to the die carrier, the sealing being arranged at a lower end of the sleeve, wherein the lower end faces the die carrier, and
   wherein the sealing does not cover the power semiconductor chip.

2. The power semiconductor device of claim 1, wherein the sealing covers the second solder joint.

3. The power semiconductor device of claim 1, wherein the sealing comprises a polymer.

4. The power semiconductor device of claim 1, wherein the sealing does not touch the power semiconductor chip.

5. The power semiconductor device of claim 1, further comprising:
   an encapsulant encapsulating the power semiconductor chip,
   wherein the encapsulant has a different material composition than the sealing.

6. The power semiconductor device of claim 5, wherein the sealing has a higher tensile strength than the encapsulant.

7. The power semiconductor device of claim 1, wherein the die carrier is a direct aluminum bond (DAB) substrate, a direct copper bond (DCB) substrate, or an active metal brazing (AMB) substrate.

8. The power semiconductor device of claim 7, wherein the sleeve is arranged on an upper conductive layer of the die carrier, and wherein the sealing is at least partially arranged on the upper conductive layer.

9. The power semiconductor device of claim 1, further comprising:
   a baseplate, wherein the die carrier is attached to the baseplate by a third solder joint.

10. The power semiconductor device of claim 1, further comprising:
    a plastic frame,
    wherein the power semiconductor chip is arranged within a cavity formed by the plastic frame, and
    wherein the pin is configured to extend out of the plastic frame.

11. A method for fabricating a power semiconductor device, the method comprising:
    providing a die carrier;
    soldering a power semiconductor chip onto the die carrier, thereby forming a first solder joint;
    soldering a sleeve for a pin onto the die carrier, thereby forming a second solder joint; and
    mechanically attaching the sleeve to the die carrier with a sealing, the sealing being arranged at a lower end of the sleeve, wherein the lower end faces the die carrier,
    wherein the sealing does not cover the power semiconductor chip.

12. The method of claim 11, wherein the sealing is provided after the first and second solder joints have been formed.

13. The method of claim 11, wherein mechanically attaching the sleeve comprises:
    dispensing the sealing around the lower end of the sleeve; and
    curing the sealing.

14. The method of claim 13, wherein the curing comprises heating the sealing to a temperature of 200° C. or less.

15. The method of claim 13, wherein the curing comprises applying UV light.

16. The method of claim 11, further comprising:
    soldering the die carrier to a baseplate, thereby forming a third solder joint.

* * * * *